(12) United States Patent
Korolev et al.

(10) Patent No.: US 10,725,125 B2
(45) Date of Patent: Jul. 28, 2020

(54) LOCAL OPERATOR INTERFACE FOR A FIELD DEVICE

(71) Applicant: Rosemount Inc., Shakopee, MN (US)

(72) Inventors: Eugene Korolev, Maple Grove, MN (US); Nicholas John Haywood, Chanhassen, MN (US)

(73) Assignee: Rosemount Inc., Shakopee, MN (US)

( * ) Notice: Subject to any disclaimer, the term of this patent is extended or adjusted under 35 U.S.C. 154(b) by 355 days.

(21) Appl. No.: 15/714,186

(22) Filed: Sep. 25, 2017

(65) Prior Publication Data

US 2019/0094314 A1    Mar. 28, 2019

(51) Int. Cl.
| | | |
|---|---|---|
| *G01R 33/07* | (2006.01) | |
| *G06F 9/451* | (2018.01) | |
| *G05B 19/042* | (2006.01) | |
| *G06F 3/02* | (2006.01) | |
| *G06F 3/0362* | (2013.01) | |

(52) U.S. Cl.
CPC ....... *G01R 33/072* (2013.01); *G05B 19/0423* (2013.01); *G05B 19/0426* (2013.01); *G06F 3/0202* (2013.01); *G06F 3/0362* (2013.01); *G06F 9/451* (2018.02); *G05B 2219/25257* (2013.01); *G05B 2219/25428* (2013.01)

(58) Field of Classification Search
CPC . G01R 33/072; G05B 19/0423; G06F 3/0202; G06F 3/0362; G06F 9/451
See application file for complete search history.

(56) References Cited

U.S. PATENT DOCUMENTS

| | | | |
|---|---|---|---|
| 8,315,058 B2 | 11/2012 | Schwartz et al. | |
| 2004/0233159 A1* | 11/2004 | Badarneh | G06F 3/016 |
| | | | 345/156 |
| 2014/0222220 A1 | 8/2014 | Fadell et al. | |
| 2015/0071465 A1* | 3/2015 | Zalisk | G06F 3/0312 |
| | | | 381/105 |
| 2017/0136621 A1* | 5/2017 | Benaim | B25J 9/1692 |
| 2017/0185160 A1* | 6/2017 | Cho | G06F 3/017 |

FOREIGN PATENT DOCUMENTS

WO    WO 03-030092 A1    4/2003

OTHER PUBLICATIONS

International Search Report and Written Opinion for International Patent Application No. PCT/US2018/051955, dated Jan. 31, 2019, date of filing: Sep. 20, 2018, 13 pages.

* cited by examiner

*Primary Examiner* — Sisay Yacob
(74) *Attorney, Agent, or Firm* — Christopher R. Christenson; Kelly, Holt & Christenson PLLC

(57) ABSTRACT

A field device includes a housing that contains field device circuitry, a display coupled to the field device circuitry and viewable through the housing, and a movable control positioned around the housing, the movable control including a magnet. The field device further includes a sensing element disposed within the housing and configured to detect movement of the magnet. In addition, the field device includes a processor coupled to the display and the sensing element. The processor is configured to identify a position of the movable control, based on the detected movement of the magnet, and control a user interface on the display, based on the identified position of the movable control.

20 Claims, 7 Drawing Sheets

LOCAL OPERATOR INTERFACE FOR A FIELD DEVICE

BACKGROUND

In industrial settings, control and monitoring systems are used to monitor and control inventories of industrial and chemical processes, and the like. Typically, the control system performs these functions using field devices distributed at key locations in the industrial process and coupled to control circuitry in the control room by a process control loop. The term "field device" refers to any device that performs a function in a distributed control or process monitoring system, including all devices used in the measurement, control and monitoring of industrial processes.

Field devices are used by the process control and measurement industry for a variety of purposes. Usually, such devices have a field-hardened enclosure so that they can be installed outdoors in relatively rugged environments and are able to withstand climatological extremes of temperature, humidity, vibration, mechanical shock, et cetera. These devices also can typically operate on relatively low power. For example, field devices are currently available that receive all of their operating power from a known 4-20 mA loop.

Field devices such as transmitters, are used in the process control industry to remotely sense a process variable. Field devices such as actuators, are used by the process control industry to remotely control physical parameters of a process, such as flow rate, temperature, etc. The process variable may be transmitted to a control room from a field device such as a transmitter for providing information about the process to a controller. A controller may then transmit control information to a field device such as an actuator to modify a parameter of the process. For example, information related to pressure of a process fluid may be transmitted to a control room and used to control a process such as oil refining.

Process variable transmitters are used to monitor process variables associated with fluids such as slurries, liquids, vapors and gasses in chemical, pulp, petroleum, gas, pharmaceutical, food and other fluid processing plants. Process variables include pressure, temperature, flow, level, pH, conductivity, turbidity, density, concentration, chemical composition and other fluid properties. Process actuators include control valves, pumps, heaters, agitators, coolers, solenoids, vents and other fluid controlling devices.

SUMMARY

A field device includes a housing that contains field device circuitry, a display coupled to the field device circuitry and viewable through the housing, and a movable control positioned around the housing, the movable control including a magnet. The field device further includes a sensing element disposed within the housing and configured to detect movement of the magnet. In addition, the field device includes a processor coupled to the display and the sensing element. The processor is configured to identify a position of the movable control, based on the detected movement of the magnet, and control a user interface on the display, based on the identified position of the movable control.

BRIEF DESCRIPTION OF THE DRAWINGS

FIG. 1-2 illustratively shows a partial cutaway view of an interface for a process transmitter, in accordance with one embodiment.

FIG. 2 illustratively shows a perspective view of a ring assembly for an interface, in accordance with one embodiment.

FIG. 3-1 illustratively shows a partial cutaway view of an interface at a first ring position, in accordance with one embodiment.

FIG. 3-2 illustratively shows a partial cutaway view of an interface at a second ring position, in accordance with one embodiment.

DETAILED DESCRIPTION OF ILLUSTRATIVE EMBODIMENTS

Some user interfaces are not fully optimized for use in a process environment. Interfaces may require establishing a communication link between the transmitter and a separate device, such as a handheld field maintenance tool, to allow an operator to enter commands to the transmitter. This is not ideal as it requires operators to carry the handheld field maintenance tool and establish a new communication link for each process transmitter. In addition, communication links can be vulnerable to security threats. Other interfaces utilize capacitive and other touch-sensitive display screens, such as those described in U.S. Pat. No. 8,315,058. While these interfaces have advantages, namely by improving the efficiency of input available to an operator, they may be vulnerable to harsh environmental conditions such as rain, snow, humidity, and various other conditions. Further, touch-sensitive interfaces may be difficult to use when operators are required to wear protective gloves or other protective gear. Touch-sensitive interfaces may also use virtual buttons that consume valuable space on the display screen. Thus, there is currently a need for an improved operator interface that is configured for use in harsh, process environments and is optimized for providing intuitive operator interaction without hindering the display of important process information.

Figure 1:
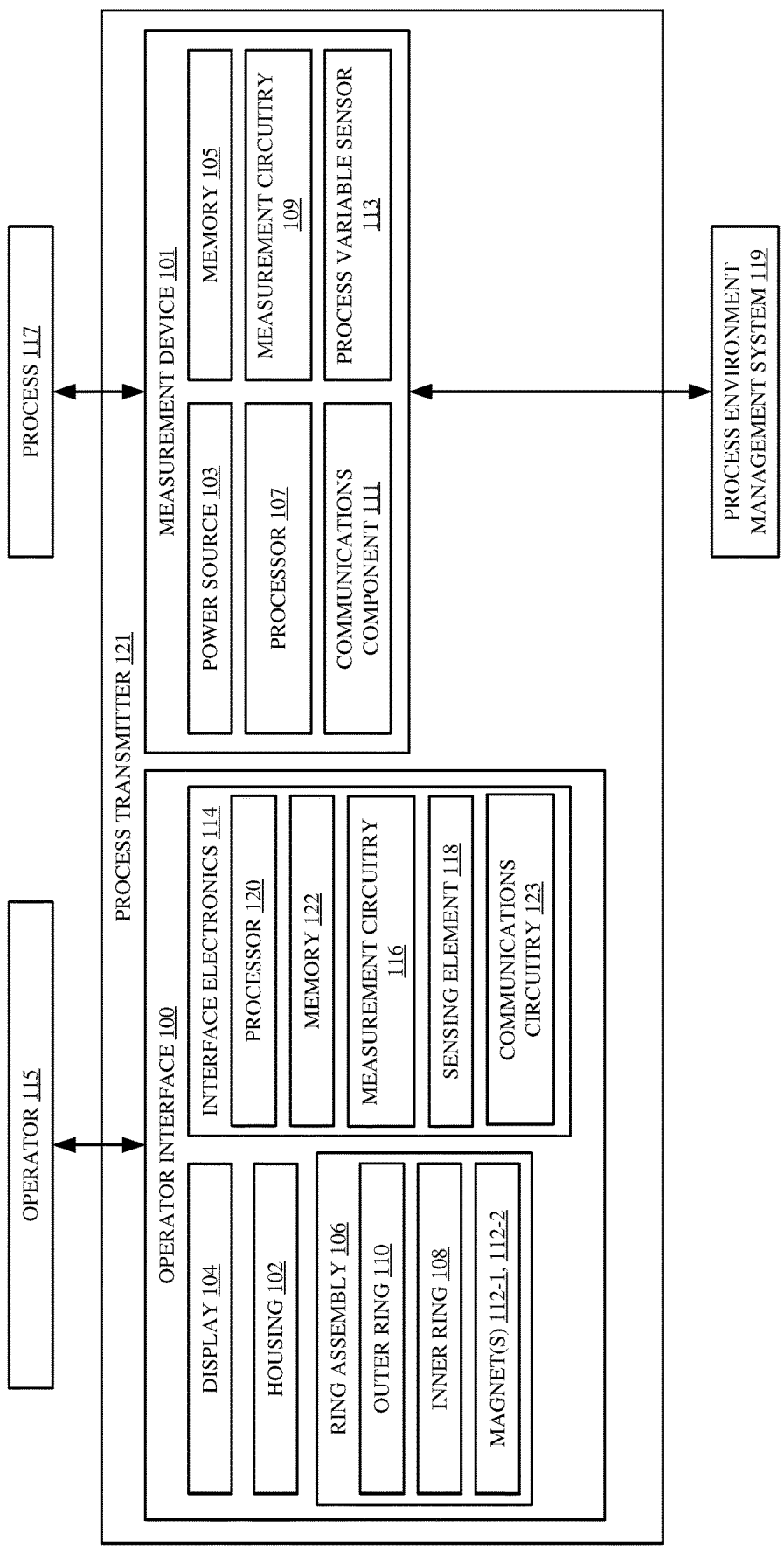
FIG. 1-1 is a block diagram of a process transmitter having an interface, in accordance with one embodiment.

FIG. 1-1 is a block diagram of a process transmitter 121 having an operator interface 100, in accordance with one embodiment. Prior to discussing operator interface 100 in further detail, an overview of measurement device 101 is provided below. It is noted that while operator interface 100 and measurement device 101 are illustratively shown in FIG. 1-1 as separate components, they can be implemented in a single process device that is installed in a process environment.

Measurement device 101 is configured to provide a measurement output indicative of a measurement of a physical characteristic of process 117, such as process fluid pressure. For example, measurement device 101 can be a wireless pressure transmitter. Measurement device 101 includes communications component 111 that facilitates communication of the process variable with, for example, process environment management system 119. Communications component 111 may be, for example, a wireless transceiver configured to transmit and receive signals. In one example, communications component 111 is configured to communicate in accordance with IEC 62591.

Process variable sensor 113 is configured to sense a process variable from process 117. For example, process variable sensor 113 may be a pressure sensor that senses a pressure of a process fluid, such as a liquid or a gas from process 117. Process variable sensor 113 can be other forms of sensors such as temperature, level, flow, etc.

Measurement circuitry 109 is configured to measure an electrical characteristic of the sensor such as capacitance or resistance in order to determine the process variable. Measurement circuitry 109 is configured to provide a digital indication of the electrical characteristic of process variable sensor 113 to processor 107.

Processor 107 is a functional component of measurement device 101 that is activated by and facilitates the functionality of other components within or coupled to the device. In the illustrated example, processor 107 is a microprocessor. In addition, processor 107 may be coupled to or include memory 105. Memory 105 includes volatile, and/or non-volatile, computer storage media, or any other type of computer memory storage configuration.

The measured process variable, as determined by measurement circuitry 109, is provided to, for example, processor 107, which provides signal to output circuitry, such as communications component 111 to generate an indication of the measured process variable. One manner in which output can be provided is by generating a measurement indication on operator interface 100. For example, processor 107 interacts with measurement circuitry 109 to provide suitable measurement outputs to operator interface 100. Processor 107 can also provide a variety of other information for display on operator interface 100.

Power source 103 can include power circuitry. In one embodiment, power source 103 includes an analog current loop that uses operating power from a known 4-20 mA loop. For example, process transmitter 121 is connected to a control room (e.g., process environment management system 119) via a two-wire process control current loop. Process transmitter 121 may transmit a signal to the control room by modulating the current running through the control loop to a current that is proportional to a sensed process variable. For instance, measurement device 101 may modulate the current on the loop based on a sensed variable.

Figures 1, 2:
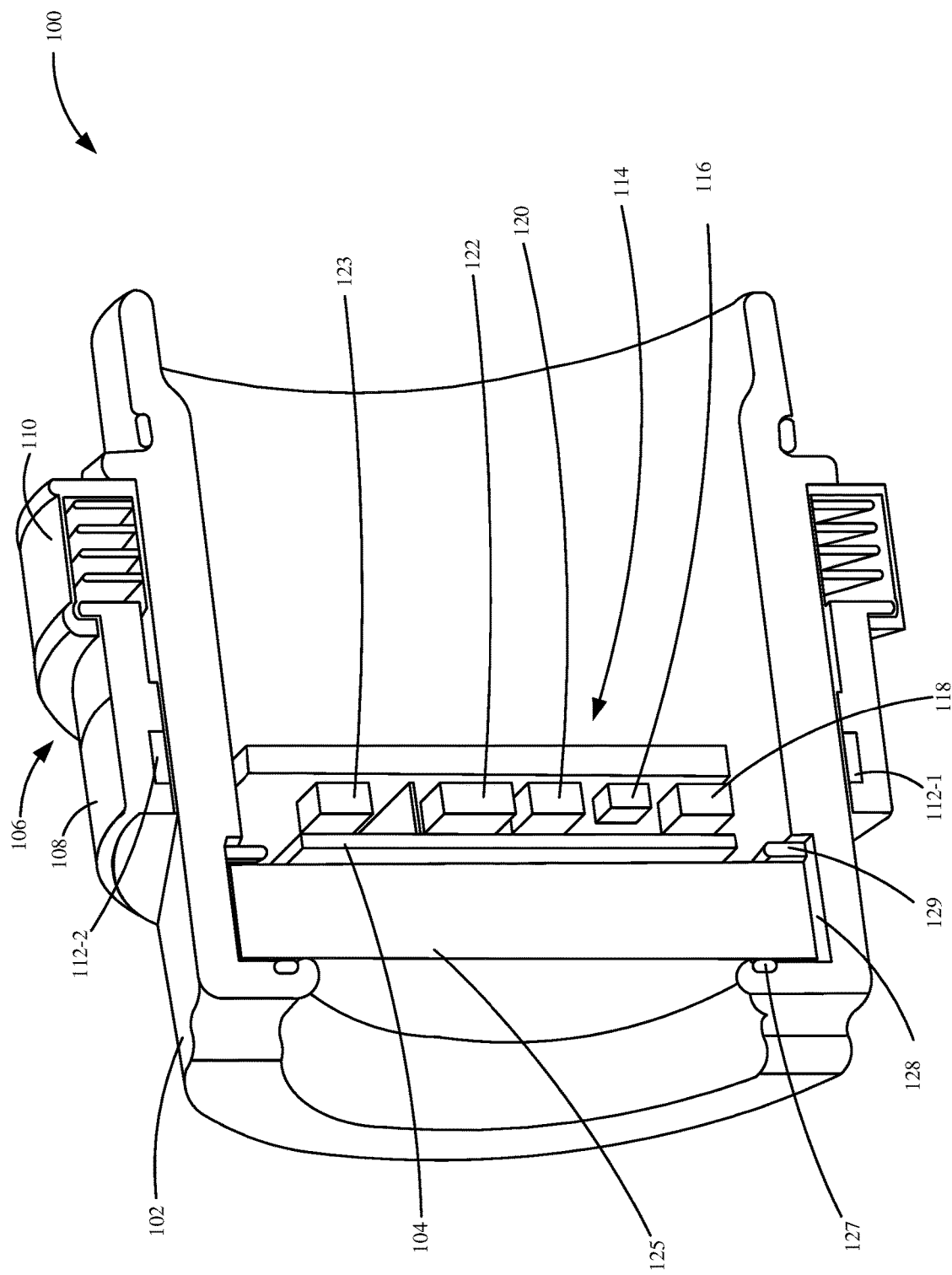
Figure 2:
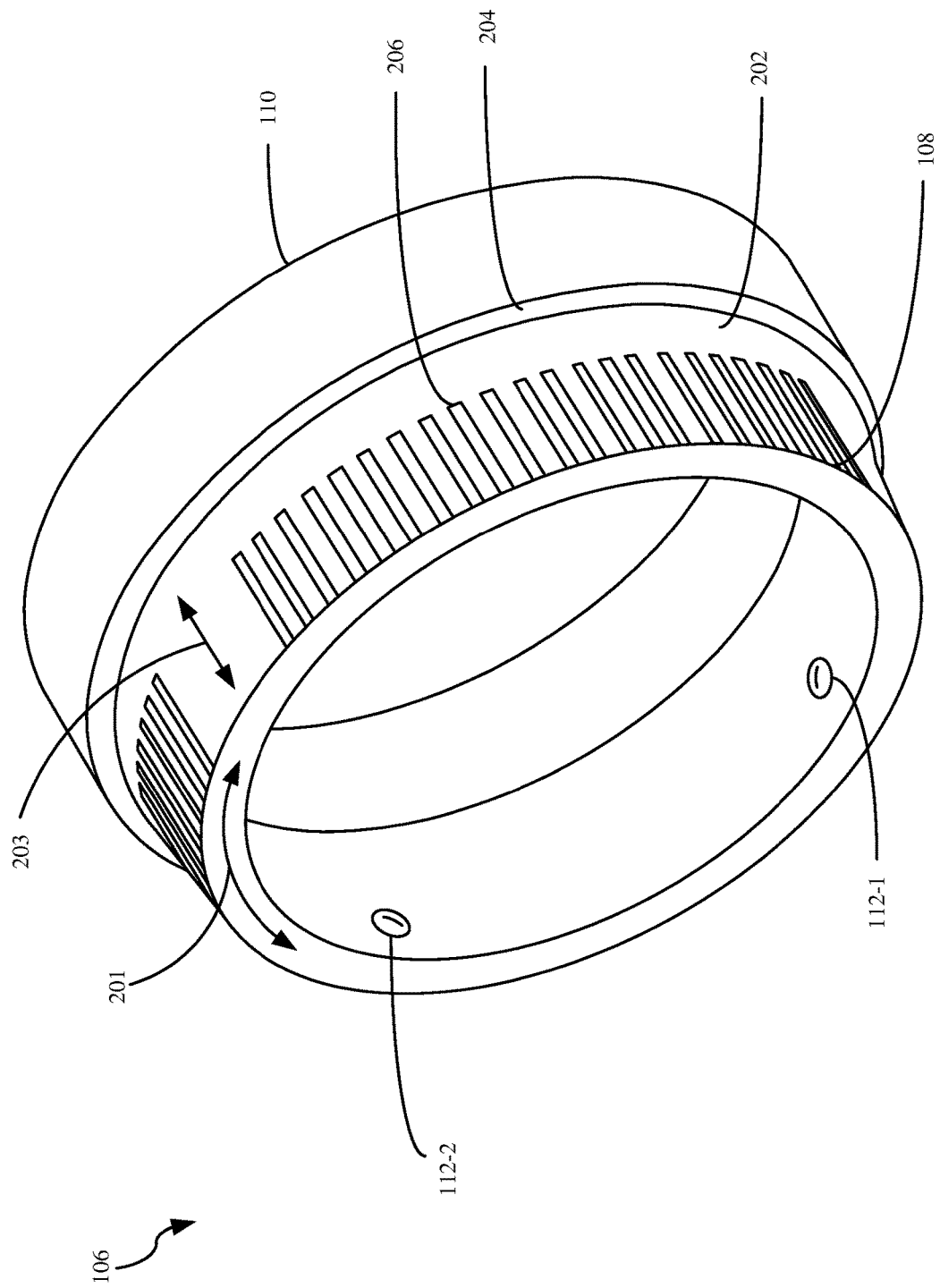

FIG. 1-2 illustratively shows a partial cutaway view of an operator interface 100 for process transmitter 121, in accordance with one embodiment. Operator interface 100 illustratively includes a housing 102, a display 104, a ring assembly 106 including an inner ring 108, an outer ring 110, a first magnet 112-1, and a second magnet 112-2. Operator interface 100 further includes interface electronics 114, which illustratively include interface measurement circuitry 116, a sensing element 118, a processor 120, memory 122, and communications circuitry 123. Operator interface 100 is generally configured to detect a user input, from operator 115, generate an action to be performed with process transmitter 121 based on the detected input, and provide an output indicative of the performed action. For instance, operator 115 interacts with operator interface 100 to select and implement a transmitter setting such as a calibration value. Of course, a variety of different actions can be implemented with operator interface 100, as will be discussed in further detail below.

It is noted that, in one embodiment, housing 102 is a housing that encloses any or all of process transmitter 121. For instance, housing 102 encloses both operator interface 100 and measurement device 101. Housing 102 is preferably a safety housing that configures operator interface 100 as an explosion-proof device for use in harsh and/or dangerous environments. Additionally, process transmitter 121 may be configured to comply with intrinsic safety requirements such that components included in the measurement device and components that are coupled to the device are intrinsically safe. One example of an intrinsic safety requirement is set forth in APPROVAL STANDARD INTRINSICALLY SAFE APPARATUS AND ASSOCIATED APPARATUS FOR USE IN CLASS I, II AND III, DIVISION 1 HAZARDOUS (CLASSIFIED) LOCATIONS, CLASS NUMBER 3610, promulgated by Factory Mutual Research October 1988. Adaptations to comply with additional industrial standards such as Canadian Standards Association (CSA) and the European CENELEC standards are also contemplated. Other FM classes such as 3615 for explosion-proof equipment are also contemplated.

Display 104 can include any of a wide variety of different displays such as a liquid crystal display (LCD), a light-emitting diode (LED) display, an organic light-emitting diode (OLED) display, etc. In the illustrated example, display 104 is an LCD display, which is configured to provide a graphical user interface. Housing 102 illustratively includes (e.g., as shown in FIG. 1-2) a glass window 125. Glass window 125 is coupled to housing 102 via seal 127 and retainer spring 129. Seal 127 illustratively includes an O-ring that forms a tight seal with display 104 such that operator interface 100 maintains the above-noted standards for intrinsic safety. In embodiments where the housing is required to be explosion-proof, a suitable cement compound 128 is provided between glass window 125 and housing 102. However, the cement is not required for an intrinsic safe housing.

Briefly, an overview of interface electronics 114 will be discussed, while details of interface electronics 114 will be provided with respect to the discussion of FIG. 3-1 and FIG. 3-2. Sensing element 118 can include any of a wide variety of different switches or sensors, such as a magnetic switch, a reed switch, and/or a hall effect sensor that senses a proximity of magnet(s) 112, such as inductive proximity. Interface measurement circuitry 116 generally includes circuitry that measures an electrical characteristic of sensing element 118, such as capacitance, resistance or inductance, to determine movement of inner ring 108 relative to outer ring 110. It is noted that interface measurement circuitry 116 can be any of a wide variety of different types of circuitry including a lower-power magnetic measurement circuit. In an example where sensing element 118 includes a hall effect sensor, interface measurement circuitry 116 is configured to be duty cycled. Interface measurement circuitry 116 can be duty cycled to reduce average power consumption of interface measurement circuitry 116. For instance, the sensing element 118 is duty cycled according to detected movement of a control (e.g., a movable ring), where the action of moving a ring is relatively slow, generating a 1 hertz (Hz) update rate.

Operator 115 can interact with operator interface 100 in a variety of ways. One particular mechanism for interacting with operator interface 100 includes ring assembly 106. FIG. 1-2 illustratively shows that outer ring 110 is coupled to housing 102. Outer ring 110 is fixedly coupled to housing 102, while inner ring 108 is movable relative to housing 102. Thus, because outer ring 110 is fixed to housing 102, inner ring 108 is also movable relative to the fixed position of outer ring 110.

FIG. 2 is a perspective view of ring assembly 106, in accordance with one embodiment. For purposes of discussion only, magnet 112-1 and magnet 112-2 are hereinafter collectively referred to as "magnet(s) 112." While two magnets 112 are illustratively shown, ring assembly 106 can include any number of magnets 112. Magnets 112 can be coupled to a portion of ring assembly 106 in a variety of ways. In the illustrated example, magnets 112 are positioned within an interior portion of inner ring 108 and are spaced apart from one another at known distances around inner ring 108.

Inner ring 108 illustratively includes an extension surface 202 and a grip surface 206. Extension surface 202 extends past grip surface 206 and is configured to engage at least a portion of outer ring 110. Grip surface 206 includes a grip pattern that is gripped by an operator to control the movement of inner ring 108. Grip surface 206 can also serve as a visual indicator regarding the position of inner ring 108 with respect to housing 102 and/or outer ring 110.

Outer ring 110 illustratively includes an outer ring lip 204 that extends perpendicular to extension surface 202. Outer ring 110, in one embodiment, has an inner diameter that is larger than an outer diameter of inner ring 108. As such, a portion of extension surface 202 can be retained by outer ring 110. The engagement of inner ring 108 with outer ring 110 at, for instance, outer ring lip 204 and extension surface 202, configures inner ring 108 to be rotatable and/or axially displaceable relative to a portion of outer ring 110. Inner ring 108 is illustratively shown as being rotatable along the direction generally indicated by arrow 201. Movement of inner ring 108 along the direction indicated by arrow 201 causes extension surface 202 to rotate along an inner portion of outer ring 110. Inner ring 108 is generally shown as being axially displaceable or "pressable" along the direction generally indicated by arrow 203. Movement of inner ring 108 along the direction indicated by arrow 203 causes extension surface 202 to be inserted under, and displaced from under outer ring lip 204. Detecting movement of inner ring 108 to process interface actions with interface electronics 114 will now be discussed in further detail with respect to FIGS. 3-1 and 3-2.

Figures 1, 3:
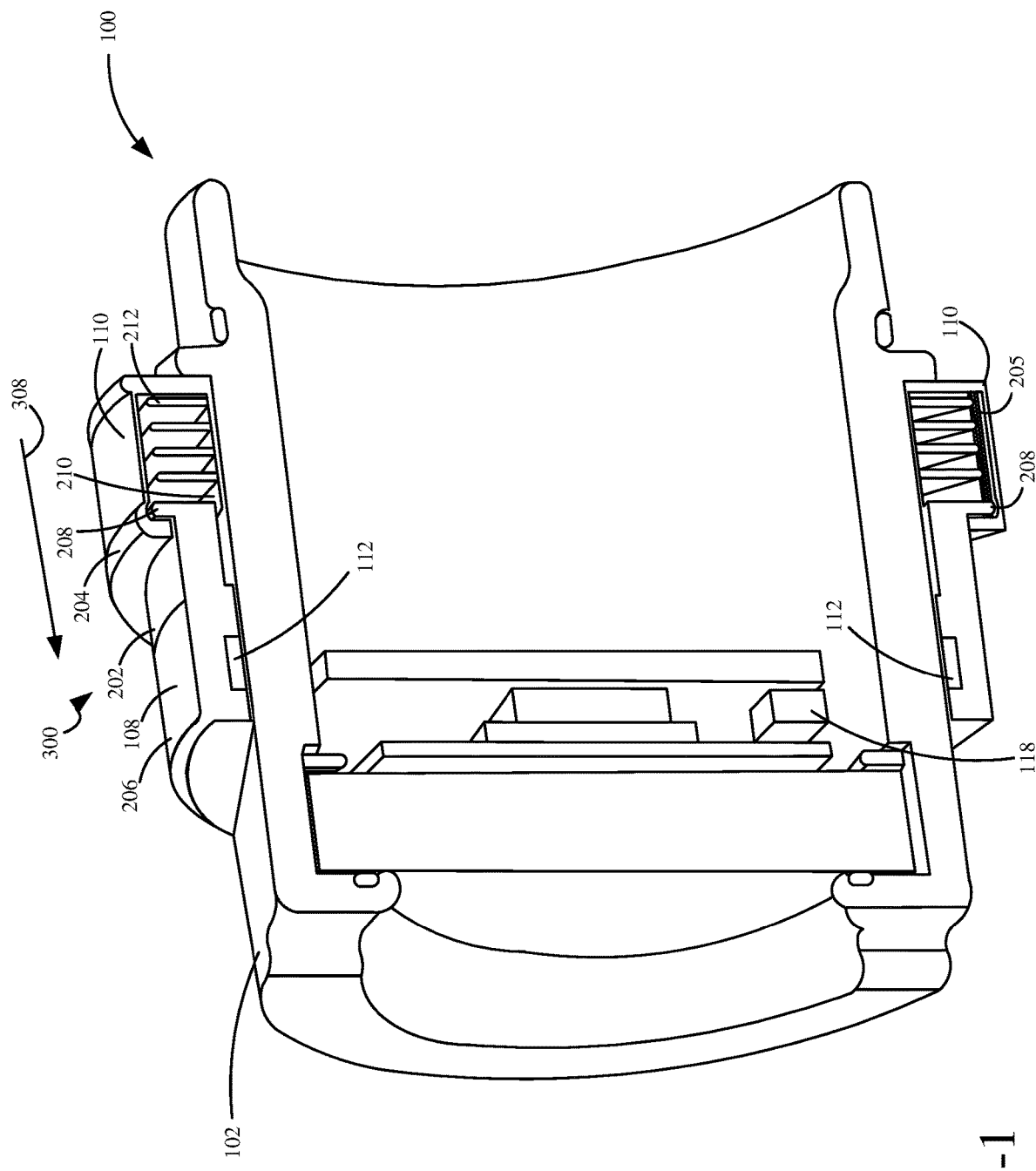
Figures 2, 3:
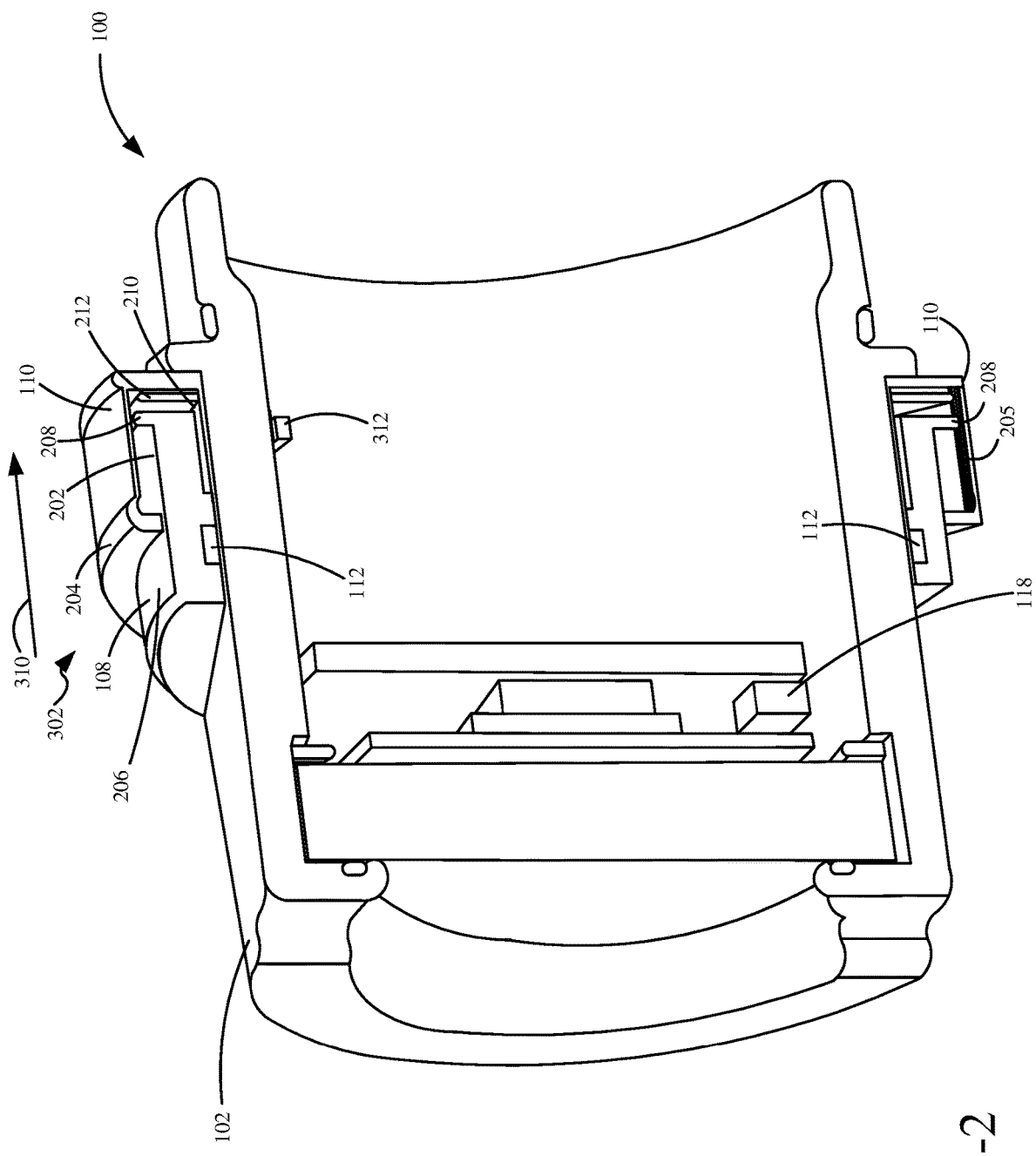

FIG. 3-1 illustratively shows a partial cutaway view of operator interface 100 at a first ring position 300, in accordance with one embodiment. First ring position 300 generally indicates a position of ring assembly 106 that defines inner ring 108 being in a non-pressed orientation.

Inner ring 108 further illustratively includes an extension surface lip 208. Extension surface 202 extends to extension surface lip 208, and extension surface lip 208 extends in a direction that is perpendicular to extension surface 202. At least a portion of inner ring 108, such as extension surface 202 and extension surface lip 208, is illustratively shown as being inserted into a retention space 210. Retention space 210 generally includes a space between housing 102 and outer ring 110. Retention space 210 includes one or more springs 212 that are configured to be compressed and extended within retention space 210. Extension surface lip 208 engages a portion of outer ring lip 204 such that extension surface 202 is (at least partially) retained within retention space 210. Engagement between outer ring lip 204 and extension surface lip 208 therefore prevents inner ring 108 from disengaging outer ring 110.

At first ring position 300, springs 212 are in a fully extended position. Springs 212 provide a spring return force in the direction generally indicated by arrow 308. The spring return force is transferred to extension surface lip 208, thereby moving inner ring 108 in the direction generally indicated by arrow 308. First ring position 300 may be indicative of a resting state of ring assembly 106, such that inner ring 108 is at first ring position 300 when no operator input is provided on the interface. For instance, at first ring position 300, a measurement is taken that is indicative of a resting state and/or a starting position of ring assembly 106.

Inner ring 108 is configured to rotate (in the direction generally indicated by arrow 201 in FIG. 2) around housing 102 when inner ring 108 is fully extended, as represented at first ring position 300. As inner ring 108 is rotated around housing 102, magnet(s) 112 successively pass a portion of housing 102 near sensing element 118. Sensing element 118 senses passing of magnet(s) 112 caused by the rotation, and generates sensor signals indicative of the inductive proximity of the magnets during the rotation. When magnet 112 is proximate sensing element 118, for instance, sensing element 118 generates a sensor signal indicative of a proximate magnet. However, when magnet 112 is remote from sensing element 118, sensing element 118 generates a sensor signal indicative no proximate magnet. To facilitate the translation of sensed proximity to a determined position of inner ring 108, magnet(s) 112 can be spaced apart from one another at known distances.

Interface measurement circuitry 116 generates digital counts indicative of the number of passes of magnet(s) 112 relative to the fixed position of sensing element 118. These digital counts are utilized by processor 120 to determine a position of inner ring 108 relative to the starting position (e.g., first ring position 300 prior to rotation of inner ring 108). As an example only, but not by limitation, a distance between each magnet is used to identify the number of magnets that pass by sensing element 118 over a time interval, such as a time interval during which rotation is detected.

Interface measurement circuitry 116 measures the sensor signal and generates a measurement indicative of proximity relative to magnet(s) 112. When magnet 112 is proximate sensing element 118, sensing element 118 generates a sensor signal indicative of a proximate magnet (e.g., a signal indicative of large induction). When magnet 112 is not proximate sensing element 118, sensing element 118 does not generate a sensor signal indicative of a proximate magnet (e.g., a signal indicative of small induction). Interface measurement circuitry 116 measures the sensor signal and generates a measurement indicative of the proximate magnets. Interface measurement circuitry 116 is configured to provide a digital indication of the measured electrical characteristic to processor 120. Interface measurement circuitry 116 measures the rotation of inner ring 108 as digital counts, where each count represents a movement of inner ring 108 a certain distance relative to housing 102. For example, each count is representative of a single pass of magnet 112 by sensing element 118. Thus, in a scenario where operator 115 rotates inner ring 108 a rotational distance (e.g., three full rotations of inner ring 108 around housing 102), interface measurement circuitry 116 generates a digital count indicative of passing, of each magnet 112, by sensing element 118 at three independent instances.

The digital counts, as measured by interface measurement circuitry 116, are provided to processor 120. Processor 120 determines a position of ring assembly 106 based on the digital counts. In the example where the digital count is 3, processor 120 determines that the count is indicative of 3 full rotations of inner ring 108 around housing 102. In addition, processor 120 identifies an action to be performed based on the determined position of ring assembly 106. For example, but not by limitation, processor 120 identifies that the ring was rotated, for instance, clockwise, three times. Processor 120 then selects an action, such as an action to navigate a menu selection three times (e.g., move a selection of a menu item from the initial item to an item that is three items away from this item, in the left to right direction, as corresponding to the clockwise rotation).

First ring position 300 is also indicative of an operator input that does not result in detection of the pressing of inner ring 108 along the axis of rotation, which is generally indicated by arrow 201. First ring position 300 generally indicates a position at which inner ring 108 is fully extended relative to outer ring 110. At first ring position 300 it is shown that magnet(s) 112 substantially align with sensing element 118 (e.g., magnet(s) 112 are spaced 180 degrees apart from one another on inner ring 108). Thus, sensing element 118 is configured to sense at least some threshold induction when ring assembly 106 is configured in first ring position 300. In other words, magnets 112 are more proximate sensing element 118 in first ring position 300 than in a second ring position, such as a position indicative of a press input being provided on operator interface 100.

FIG. 3-2 illustratively shows a partial cutaway view of operator interface 100 at a second ring position 302, in accordance with one embodiment. Briefly, as similarly noted above with respect to first ring position 300 and FIG. 3-1, it is noted that inner ring 108 is also configured to rotate (in the direction generally indicated by arrow 201 in FIG. 2) around housing 102 when operator interface 100 is at second ring position 302.

It is also noted that extension surface lip 208 is configured to interact with one or more grooves 205 disposed along an inner surface of outer ring 110. Interaction of extension surface lip 208 with the one or more grooves 205 provides a ratcheting mechanism by which rotation of inner ring 108 is restricted to fixed incremental movements. For instance, rotation of inner ring 108 causes extension surface lip 208 to frictionally engage and disengage outer ring 110, respectively, at 30 degree increments around housing 102. This not only provides tactile feedback for operator 115 during interaction with inner ring 108, but also improves the ability of measurement circuitry 116 and processor 120 to determine the position of inner ring 108 relative to magnets 112. For example, each incremental, 30 degree movement of inner ring 108 can cause sensing element 118 to generate a unique sensed characteristic of the relative proximity of magnets 112. For tactile purposes, the ratcheting of inner ring 108 with grooves 205 of outer ring 110 can also provide a clicking sound that aids in providing operator 115 with feedback of the input. Of course, other tactile and/or haptic feedback mechanisms are contemplated herein.

Second ring position 302 generally indicates a position of ring assembly 106 that defines inner ring 108 being in a pressed orientation. For instance, operator 115 provides an input on inner ring 108 that presses inner ring 108 in the direction generally indicated by arrow 310. Arrow 310 generally indicates a direction that is along an axis of rotation and horizontal to housing 102, and thus horizontal to at least one position of sensing element 118. In response, inner ring 108 slidably moves in the horizontal direction indicated by arrow 310 and compresses springs 212 within retention space 210. More specifically, extension surface lip 208 compresses springs 212.

In one embodiment, the pressed orientation of inner ring 108 causes a weak magnetic field to be sensed. For instance, at second ring position 302, sensing element 118 senses that magnets 112 are not proximate to sensing element 118. To determine that magnet 112 is not proximate to sensing element 118, the sensed magnetic field at second ring position 302 can be characterized as a weak magnetic field, using the sensed magnetic fields of various other positions as reference. For example, the sensed magnetic field when inner ring 108 is at second ring position 302 is generally weaker, or less inductive, than that of a sensed magnetic field when inner ring 108 is at any of the rotational positions of first ring position 300. This is because the orientation of interface 100 allows for magnets 112 to be moved axially (e.g., as caused by a press on inner ring 108) along the direction generally indicated by arrow 308, and therefore to be moved to a greater distance from sensing element 118.

FIGS. 3-1 and 3-2 illustratively show that interface 100 can also or alternatively include a second sensing element 312. Second sensing element 312 is shown as being generally disposed within housing 102 at a position near second ring position 302. Of course, it is contemplated herein that second sensing element 312 can be positioned within housing 102 at a variety of other positions. Second sensing element 312 can include any or all of the features described herein with respect to sensing element 118.

Measurement circuitry 116 is configured to receive a sensed characteristic from second sensing element 312 and provide the characteristic to processor 120, which is configured to differentiate between characteristics sensed by sensing element 118 and those sensed by second sensing element 312. At first ring position 300, magnets 112 are not proximate second sensing element 312. Thus, second sensing element 312 generates a sensor signal indicative of a not proximate magnet. This indicates that no press input has been provided on inner ring 108, as determined by processor 120. When inner ring 108 is pressed in the direction generally indicated by arrow 310 to second ring position 302, second sensing element 312 senses that magnets 112 are in proximity to second sensing element 312. Therefore, at second ring position 302, second sensing element 312 generates a sensor signal indicative of a proximate magnet. This indicates that magnet(s) 112 were towards second sensing element 312 along the axial direction indicated by arrow 310, and processor 120 therefore determines that a press input has been provided on inner ring 108.

As such, sensing element 118 and/or second sensing element 312 detect movement of ring assembly 106, interface measurement circuitry 116 measures digital counts of the detected movement, and processor 120 translates the digital counts to a tangible position of ring assembly 106, which is determined to be indicative of an input on ring assembly 106 provided by operator 115. The determined input, provided by operator 115, is then utilized by processor 120 to select an action to be performed with process transmitter 121.

Figure 4:
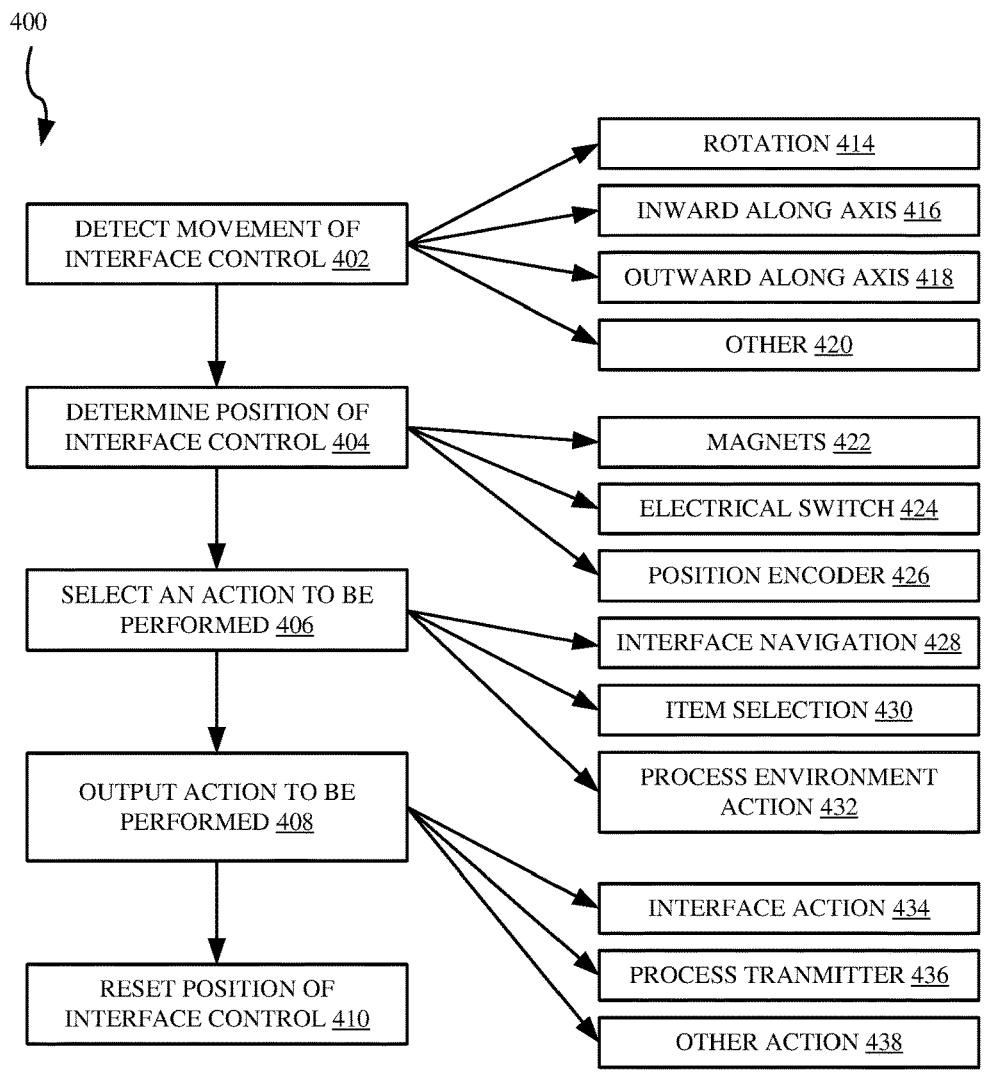
FIG. 4 is a flow diagram illustrating a method of operating an interface of a process transmitter, in accordance with one embodiment.

FIG. 4 is a flow diagram of a method 400 of operating an interface of a process transmitter, in accordance with one embodiment. At block 402, method 400 includes detecting movement of an interface control, such as movement of a movable ring. Detecting movement can include detecting rotation, as indicated by block 414. As an example, block 414 includes detecting rotation caused by rotation of an inner ring around a housing of the interface. Detecting movement can also or alternatively include detecting inward movement along an axis, as indicated by block 416. For instance, block 416 includes detecting pressing of an inner ring inward, into a portion of an encompassing ring assembly such as an outer ring. Detecting movement can further include detecting outward movement along an axis, as indicated by block 418. For instance, block 418 includes detecting movement caused by the release of a pressed ring. Other movement can also or alternatively be detected, as indicated at block 420.

Method 400 further includes the step of determining a position of the interface control, as indicated at block 404. The interface control can be moved, by an operator, to a variety of positions, and determination of those positions can allow an output to be selected. For instance, a position of the control can be determined by sensing a proximity of magnets, as indicated by block 422. In one example, an electrical switch is utilized to sense a proximity of magnets, as indicated by block 424. Further, determining a position of the control can include utilizing a position encoder, as indicated at block 426. For example, but not by limitation, using a position encoder can include using an electrical switch that senses induction of magnets and measurement circuitry that decodes the sensed induction to generate digital counts indicative of the movement. The digital counts (e.g., from the position encoder) are used by a processor to identify a tangible position of the control as it relates to an input provided by an operator. As an example only, the position can be determined as a position that is characterized into one of three categories: A) rotation from point A to point B; B) pressing of control inwards at a specific rotational position; and C) release of a pressed control or moving the control outwards at a specific rotational position.

Based on the determined position of the interface control, method 400 includes outputting an indication of an action to be performed, as indicated by block 408. User input on the control is therefore used to select and output an action to be performed. The action that is output can include an action to be performed on the operator interface, such as a menu navigation input and/or a menu item selection input, as shown at block 434. In addition, the action can include an action to be performed on the field device, such as a calibration value setting, as indicated at block 436. Of course, other actions can be output in accordance with block 438.

Method 400 further includes resetting a position of the interface control. When an action is based on the detected movement and ring position, measurement circuitry resets the digital count in preparing to process future inputs.

Figure 5:
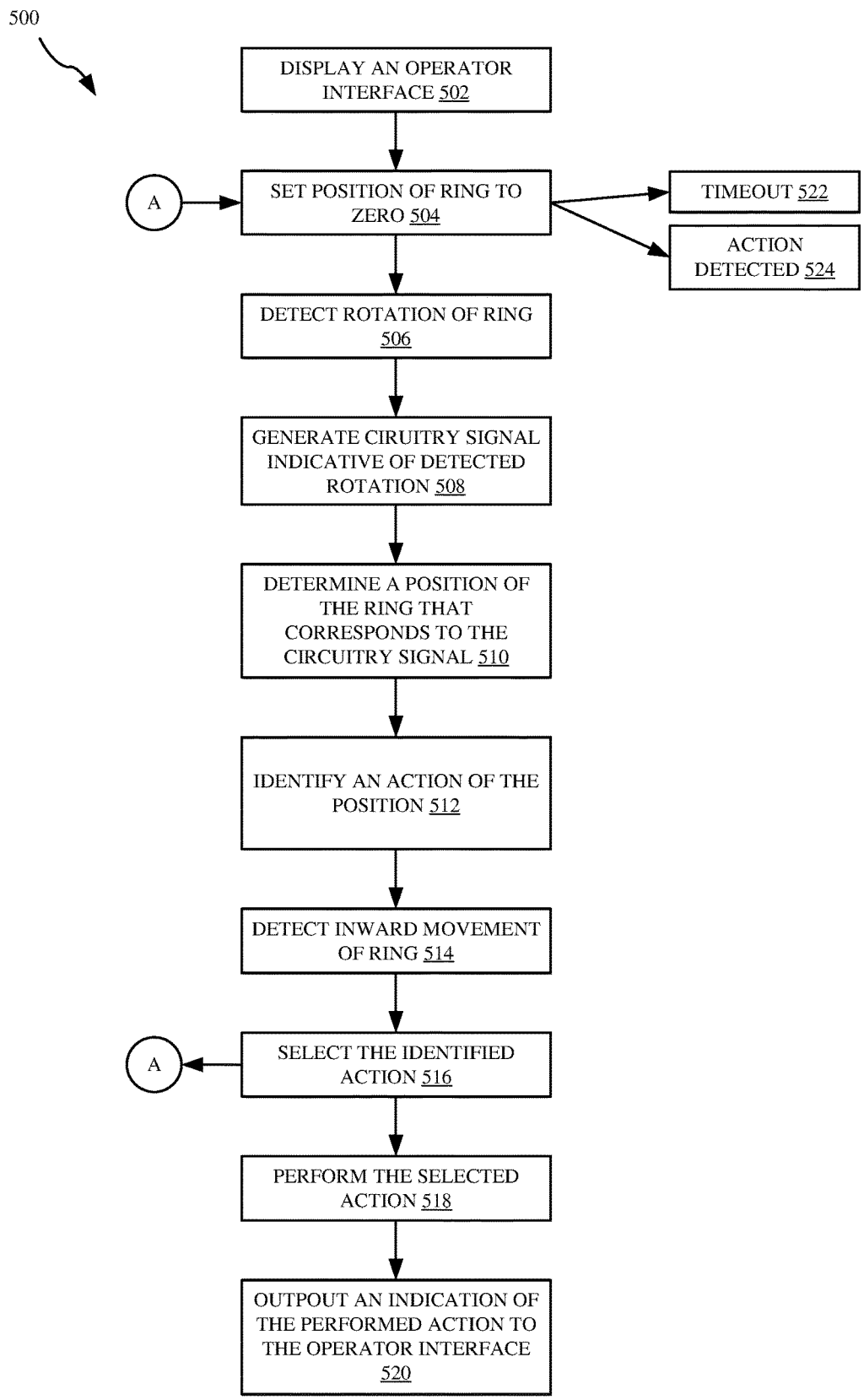
FIG. 5 is a flow diagram illustrating a method of processing input provided on an operator interface, in accordance with one embodiment.

FIG. 5 is a flow diagram of a method 500 of processing input on an operator interface of a field device, in accordance with one embodiment. At block 502 of method 500, an operator interface is displayed. For instance, an operator interface is generated on a display screen of a process transmitter that is installed in a process environment.

At block 504, a ring position is set to zero or otherwise reset. As such, further movement of the ring can be detected once the initial position is reset or nullified. Setting the ring position to zero can be triggered by a timeout event, as indicated by block 522, and/or detection of an action performed (or attempted to be performed) as a result of prior input on the interface, as indicated by block 524. At block 506, rotation of the ring is detected. Detecting ring rotation can include detecting movement of magnets, which are coupled to a movable inner ring that is rotated by an operator. Of course, rotational movement of the ring can be detected in others, as indicated by block 506. At block 508, method 500 includes generating a signal indicative of the detected rotation of the ring. At block 510, a position of the ring is determined based on the rotation. In one embodiment, a processor identifies the new position of the ring based on a comparison between the new circuitry signal and a mapping of known circuitry signals to known positions or movements of the ring.

At block 512, an action for the determined position is identified. As an example, the operator interface includes a display of a menu having items. The menu is navigated according to the detected movement of the ring. Specifically, rotation of the ring can sequentially navigate selection of items displayed in the menu. As such, an operator can rotate the ring at various intervals to change a menu selection. At block 512, the action that is identified includes a menu item that is, for instance, indicated on the display as being identified (e.g., by highlighting the menu item on the display or providing another visual indication on the display).

At block 514, method 500 includes detecting inward movement of the ring. Inward movement of the ring is detected by sensing proximity of the ring relative to an electrical switch. The ring is detected as being moved inward, for instance, because the ring has been moved distally away from the switch and a sensed induction is decreased (e.g., compared to a sensed induction when the ring is not pressed inwards).

At block 516, the identified action is selected. For instance, inward movement of the ring triggers a menu selection action that selects the menu item identified from the rotation of the ring. At block 518, the selected action is performed in response to the detected inward movement of the ring. As discussed above, the selected action can include interface actions and/or actions to be performed on the process environment. At block 520, method 500 includes outputting an indication of the performed action to the operator interface. For instance, an indication of the action being successfully completed, unsuccessfully completed, attempted, or in-progress of attempt, can be provided to the operator interface. The output can be a visual output on the display or, for instance, haptic feedback.

Although the present invention has been described with reference to preferred embodiments, workers skilled in the art will recognize that changes may be made in form and detail without departing from the spirit and scope of the invention. For example, while embodiments of the present invention have been described with respect to a process variable transmitter, embodiments can be practiced with other types of field devices including valve controllers, positioners, and field signal indicators.

What is claimed is:

1. A field device comprising:
 a housing containing field device circuitry;
 a display coupled to the field device circuitry and viewable through the housing;
 a movable control positioned around the housing, the movable control comprising a magnet;
 a sensing element disposed within the housing and configured to detect movement of the magnet; and
 a processor coupled to the display and the sensing element, the processor being configured to:
  identify a position of the movable control, based on detected movement of the magnet; and
  control a user interface on the display, based on the identified position of the movable control.

2. The field device of claim 1, wherein the movable control comprises:
 an outer ring that is fixed to the housing; and
 an inner ring that is movable relative to the housing.

3. The field device of claim 2, wherein the detected movement comprises one or more of:
 detected rotation of the inner ring around the housing; and
 detected insertion of the inner ring into the outer ring.

4. The field device of claim 2, wherein the magnet is disposed in the inner ring.

5. The field device of claim 1, wherein the field device circuitry is intrinsically safe.

6. The field device of claim 1, wherein, the housing has an explosion-proof rating.

7. The field device of claim 1, wherein the sensing element comprises a reed switch.

8. The field device of claim 1, wherein the sensing element comprises a hall effect sensor.

9. The field device of claim 8, wherein the hall effect sensor is duty-cycled according to detected movement of the movable control.

10. A process transmitter comprising:
a housing that contains field device circuitry;
a display coupled to the field device circuitry and viewable through the housing;
a ring positioned around the housing, the ring having a magnet therein;
a sensing element disposed within the housing and configured to detect movement of the magnet;
a processor coupled to the display and the sensing element, the processor being configured to:
identify a ring position based on detected movement of the magnet; and
select an action to be performed on a user interface on the display, based on the identified ring position;
a process variable sensor configured to sense a process variable; and
communication circuitry configured to transmit an indication of the sensed process variable.

11. The process transmitter of claim 10, wherein the ring comprises an inner portion that is configured to rotate around the housing along a direction of rotation.

12. The process transmitter of claim 11, wherein the ring further comprises an outer portion, and wherein the inner portion is movable, relative to the outer portion, along an axis of rotation.

13. The process transmitter of claim 10, wherein the selected action comprises at least one of:
a menu navigation action that navigates a menu on the user interface; and
an item selection action that selects a menu item on the user interface.

14. The process transmitter of claim 13, wherein the detected movement comprises at least one of:
movement of the ring around the housing; and
movement of the ring in an axial direction relative to the housing.

15. The process transmitter of claim 14, wherein the processor is further configured to:
in response to detecting movement of the ring around the housing, perform the menu navigation action on the menu; and
in response to detecting movement of the ring in an axial direction relative to the housing, perform the item selection action to select the menu item.

16. The process transmitter of claim 10, wherein circuitry of the process transmitter is intrinsically safe.

17. The process transmitter of claim 16, wherein process transmitter is installed in a process environment.

18. A method of controlling an operator interface for a process transmitter, the method comprising:
receiving a user control input that moves a movable control, the movable control being movable relative to the process transmitter;
detecting movement of a magnet coupled to the movable control with the process transmitter;
generating a signal indicative of the detected movement;
providing the generated signal to a processor coupled to the process transmitter;
determining, by the processor, a position of the movable control; and
outputting, by the processor, an output to the operator interface based on the determined position.

19. The method of claim 18, wherein detecting movement of the magnet comprises:
detecting movement of the magnet relative to a magnetic switch, wherein the magnet is movable with the movable control and wherein the magnetic switch is fixed to the process transmitter.

20. The method of claim 19, wherein the generated signal is indicative of movement of the magnet relative to the magnetic switch, and wherein determining the position of the movable control comprises:
determining whether the magnet was moved along an axial direction, relative to the magnetic switch;
determining whether the magnet was moved along a rotational direction, relative to the magnetic switch;
if the magnet was moved along the axial direction, determining that the position of the movable control corresponds to a user control input that presses the movable control inwards along the axial direction; and
if the magnet was moved along the rotational direction, determining that the position of the movable control corresponds to a user control input that rotates the movable control along the rotational direction.

* * * * *